United States Patent
Okamura et al.

(10) Patent No.: US 7,373,581 B2
(45) Date of Patent: May 13, 2008

(54) DEVICE, PROGRAM, AND METHOD FOR DECODING LDPC CODES

(75) Inventors: Toshihiko Okamura, Tokyo (JP); Hiroaki Anada, Tokyo (JP)

(73) Assignee: NEC Corporation, Tokyo (JP)

( * ) Notice: Subject to any disclaimer, the term of this patent is extended or adjusted under 35 U.S.C. 154(b) by 493 days.

(21) Appl. No.: 10/721,099

(22) Filed: Nov. 26, 2003

(65) Prior Publication Data
US 2004/0153938 A1  Aug. 5, 2004

(30) Foreign Application Priority Data
Dec. 3, 2002  (JP) ............................. 2002-350846

(51) Int. Cl.
*H03M 13/00* (2006.01)
(52) U.S. Cl. .................................... 714/752
(58) Field of Classification Search ........ 714/800–802, 714/807
See application file for complete search history.

(56) References Cited

U.S. PATENT DOCUMENTS

| | | | | |
|---|---|---|---|---|
| 7,120,856 | B2* | 10/2006 | Zhang et al. ................ | 714/801 |
| 2005/0257124 | A1* | 11/2005 | Richardson et al. ......... | 714/796 |
| 2005/0268206 | A1* | 12/2005 | Tran et al. ................... | 714/758 |
| 2005/0278606 | A1* | 12/2005 | Richardson et al. ......... | 714/760 |
| 2006/0085720 | A1* | 4/2006 | Tran et al. ................... | 714/758 |

OTHER PUBLICATIONS

Wikipedia Kronecker product definition and properties. web site is http://en.wikipedia.org/wiki/Kronecker_product.*

D. Mackay, "Good Error-Correcting Codes Based on Very Sparse Matrices", IEEE Transactions on Information Theory, vol. 45, No. 2, (Mar. 1999), pp. 399-431 with Abstract.

E. Boutillon et al., "Decoder-First Code Design", $2^{th}$ International Symposium on Turbo Codes and Related Topics, (2000), pp. 459-462 with Abstract.

Tong Zhang; Parhi, K.K. Joint code and decoder design for implementation-oriented (3,k)-regular LDPC codes, Signals, Systems and Computers, 2001, Conference Record of the Thirty-Fifth Asilomar Conference, USA, IEEE, Nov. 4, 2001, vol. 2, 1232-1236.

* cited by examiner

*Primary Examiner*—Jacques Louis-Jacques
*Assistant Examiner*—Sam Rizk
(74) *Attorney, Agent, or Firm*—Sughrue Mion, PLLC

(57) ABSTRACT

A parallel decoder, which is simpler and more flexible than conventional devices, is provided in decoding device for a LDPC code. The present invention includes a plurality of memory units for storing a received value and a message generated during a Message-Passing decoding, a plurality of variable node function units, a plurality of check node function units, a plurality of address generation units for generating an address of each of memory units, and a plurality of shuffle network units for determining a connection between variable node function units and check node function units. An address generation unit generates an address on the basis of a plurality of permutations. Each shuffle network unit is connected to some of the variable node function units. This connection is determined on the basis of a plurality of permutations. A change of the permutations in the address generation units and a change of the permutations in the shuffle network units are performed in the same cycle in a decoding process.

15 Claims, 12 Drawing Sheets

FIG. 3

$$H = \begin{pmatrix} R(1,1) & \cdots & R(1,K) \\ \cdots & \cdots & \cdots \\ R(J,1) & \cdots & R(J,K) \end{pmatrix}$$ — 301

$$R(j,k) = Q(j,k) \otimes P(j,k)$$ — 302

FIG. 8

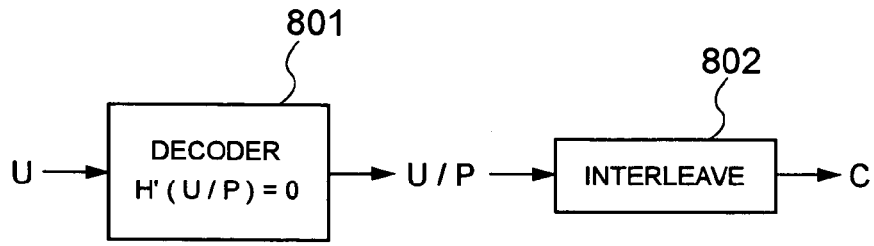

FIG. 9A $$(Q(j,k)) = \begin{pmatrix} 1 & 0 & 0 & 1 & 1 & 0 \\ 0 & 1 & 1 & 0 & 0 & 1 \\ \hline 0 & 1 & 1 & 0 & 0 & 1 \\ 1 & 0 & 0 & 1 & 1 & 0 \end{pmatrix} \Bigg\} 901$$

FIG. 9B $$(P(j,k)) = \begin{pmatrix} 0 & 0 & 1 & 1 & 0 & 0 & 0 & 1 & 0 \\ 0 & 1 & 0 & 0 & 1 & 0 & 0 & 0 & 1 \\ 1 & 0 & 0 & 0 & 0 & 1 & 1 & 0 & 0 \\ \hline 0 & 0 & 1 & 0 & 1 & 0 & 1 & 0 & 0 \\ 1 & 0 & 0 & 0 & 0 & 1 & 0 & 0 & 1 \\ 0 & 1 & 0 & 1 & 0 & 0 & 0 & 1 & 0 \end{pmatrix} \Bigg\} 902$$

FIG. 9C $$H = (R(j,k)) = (Q(j,k) \otimes P(j,k)) = \begin{pmatrix} 0 & 0 & 1 & 0 & 0 & 0 & 0 & 0 & 0 & 1 & 0 & 0 & 0 & 1 & 0 & 0 & 0 & 0 \\ 0 & 1 & 0 & 0 & 0 & 0 & 0 & 0 & 0 & 0 & 1 & 0 & 0 & 0 & 1 & 0 & 0 & 0 \\ 1 & 0 & 0 & 0 & 0 & 0 & 0 & 0 & 0 & 0 & 0 & 1 & 1 & 0 & 0 & 0 & 0 & 0 \\ 0 & 0 & 0 & 0 & 0 & 1 & 1 & 0 & 0 & 0 & 0 & 0 & 0 & 0 & 0 & 0 & 1 & 0 \\ 0 & 0 & 0 & 0 & 1 & 0 & 0 & 1 & 0 & 0 & 0 & 0 & 0 & 0 & 0 & 0 & 0 & 1 \\ 0 & 0 & 0 & 1 & 0 & 0 & 0 & 0 & 1 & 0 & 0 & 0 & 0 & 0 & 1 & 0 & 0 & 0 \\ \hline 0 & 0 & 0 & 0 & 0 & 1 & 0 & 1 & 0 & 0 & 0 & 0 & 0 & 0 & 0 & 1 & 0 & 0 \\ 0 & 0 & 0 & 1 & 0 & 0 & 0 & 0 & 1 & 0 & 0 & 0 & 0 & 0 & 0 & 0 & 0 & 1 \\ 0 & 0 & 0 & 0 & 1 & 0 & 1 & 0 & 0 & 0 & 0 & 0 & 0 & 0 & 1 & 0 & 0 \\ 0 & 0 & 1 & 0 & 0 & 0 & 0 & 0 & 0 & 0 & 1 & 0 & 1 & 0 & 0 & 0 & 0 & 0 \\ 1 & 0 & 0 & 0 & 0 & 0 & 0 & 0 & 0 & 0 & 0 & 1 & 0 & 0 & 1 & 0 & 0 & 0 \\ 0 & 1 & 0 & 0 & 0 & 0 & 0 & 0 & 0 & 1 & 0 & 0 & 0 & 1 & 0 & 0 & 0 & 0 \end{pmatrix} \Bigg\} 903$$

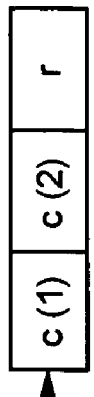

$$\begin{pmatrix} P & P & 0 & 0 & 0 & 0 & P & P & P & P \\ P & P & P & P & P & 0 & 0 & 0 & 0 & P \\ P & P & P & P & 0 & P & 0 & 0 & P & 0 \\ P & P & P & 0 & P & P & 0 & P & 0 & 0 \\ P & P & 0 & P & P & P & P & 0 & 0 & 0 \end{pmatrix}$$

$$H = \begin{pmatrix} \overset{1}{1} & \overset{2}{0} & \overset{3}{0} & \overset{4}{1} & \overset{5}{0} & \overset{6}{1} & \overset{7}{1} & \overset{8}{1} \\ 0 & 1 & 1 & 1 & 0 & 1 & 0 & 1 \\ 1 & 1 & 0 & 1 & 1 & 0 & 0 & 0 \\ 1 & 0 & 1 & 0 & 1 & 0 & 1 & 1 \end{pmatrix} \begin{matrix} 1 \\ 2 \\ 3 \\ 4 \end{matrix}$$

PARITY CHECK MATRIX H

TANNER GRAPH G

DEVICE, PROGRAM, AND METHOD FOR DECODING LDPC CODES

BACKGROUND OF THE INVENTION

1. Field of the Invention

The present invention relates to an error correcting code decoding device, a program and a method used therein and more particularly to an error correcting code decoding device, a program and a method used therein for a Low-Density Parity-Check Code (hereinafter referred to as LDPC code).

2. Description of the Related Art

The error correcting code is a technique for reducing noise effects during data transmission by such processing as coding or decoding. Coding is a process of adding redundancy to data to be transmitted. The coded data is called a codeword. A codeword sent into a communication channel is affected by noise, resulting in such an error as having some bits reversed when the codeword is received. Decoding is a process of recovering data from such an error-ridden received word by using redundancy.

A LDPC code is an error correcting code proposed in 1960s. The LDPC code had not drawn attention until late 1990s, when a relation between the LDPC code and the Turbo code was pointed out. (For example, see Non-Patent Document 1)

Non-Patent Document 1: D. J. C. Macky and R. M. Neal, "Good error correcting codes based on very sparse matrices," IEEE Transactions on Information Theory 45 pp. 399-431, 1999.

For an error correcting code, a decoding process, which is typically an estimation process, is more complicated than a coding process. Particularly, in order to provide maximum likelihood decoding or a decoding performance near to that on a code of high error-correction performance with a long code length, a decoding process needs to take on extremely high complexity.

A LDPC code features a parity check matrix with an extreme number of 0s. This feature enables relatively effective high-performance decoding method, which is called Message-Passing decoding (hereinafter referred to as MP decoding).

Now, MP decoding on a LDPC code will be described. For simplicity, it is assumed that a code is a binary, and a modulation system is BPSK, in which a soft decision value of +1 for bit 0 of a codeword or −1 for bit 1 in the case of no error would be a received value.

MP decoding on a LDPC code will be described by using a bipartite graph, which is called Tanner graph corresponding to a parity check matrix. FIGS. 14A and 14B show examples of parity check matrix H and its corresponding Tanner graph G, respectively.

Nodes on Tanner graph G are classified into two types; variable nodes and check nodes. A variable node corresponds to a column of matrix H, i.e., codeword bit, while a check node corresponds to a row of matrix H. By connecting between nodes on Tanner graph G whose cross point on matrix H is filled with 1 by an edge, a graph for the matrix H is made, which is called Tanner graph corresponding to matrix H.

Decoding method on a LDPC code is performed by repeatedly updating a quantity called "message" assigned to an edge of a graph on a node. A message has two types; a message from a check node to a variable node and a message from a variable node to a check node. Each type of message corresponds to reliability information on a codeword bit calculated at a node.

A number of methods are known for an algorithm at a variable node and a check node.

One of the methods with the most efficient decoding feature is sum-product algorithm. A method called the min-sum algorithm with relatively low complexity is described here.

It is assumed that a received value of a codeword bit corresponding to a certain valuable node is r, and a message from a checknode to this variable node is $c(1), (2), \ldots, c(d\_v)$ ($d\_v$ is a number of edges coming out from the variable node). The variable node sends out $v(1)$, which is expressed in [expression 1], to a check node at the other end of a corresponding edge.

$$v(1) \leftarrow r + c(2) + \ldots + c(d\_v) \qquad \text{[expression 1]}$$

$v(i)$ ($i=2, \ldots, d$) is also obtained as a sum of r and $c(j)$ ($j \neq i$).

When it is assumed that a message to a certain check node is $v(1), \ldots, v(d\_c)$ ($d\_c$ is a number of edges coming out from the check node), the check node sends out $c(1)$, which is expressed in [expression 2], to a variable node at the other end of corresponding edge.

$$c(1) \leftarrow \text{sgn}(v(2), \ldots, v(d\_c)) \cdot \min\{|v(2)|, \ldots, |v(d\_c)|\} \qquad \text{[expression 2]}$$

where $\text{sgn}(v(2), \ldots, v(d\_c))$ is a value of $v(i)$ ($i=2, \ldots, d\_c$) multiplied by a sign (+1 or −1), |a| is an absolute value of a, and min is a function for selecting the minimum value.

$c(i)(i=2, \ldots, d)$ is also obtained by using $v(j)$ ($j \neq i$).

A LDPC code has a small number of edges for each node. Thus, [expression 1] and [expression 2] can be processed with low complexity.

Here we call a processing unit performing [expression 1] and [expression 2] once for all nodes "1 iteration process". MP decoding is accomplished by repeating this literation process. The number to be repeated is generally around 10 to 30.

The final decision of 0 and 1 (hard decision) is performed by deciding whether [expression 3] is positive or negative at each codeword bit.

$$r + c(1) + \ldots + c(d\_v) \qquad \text{[expression 3]}$$

When a result of the hard decision for each of all the check nodes is obtained, iteration process of MP decoding finishes.

If the entire graph G can be embodied in a device, the processes are expected to be speedier, which is difficult because a LDPC code is generally used in a long code length (1000-). Therefore, a message is stored in memory, some of the graph G nodes are operated in parallel by sharing a circuit so that complexity and throughput of a device is adjusted.

There is a coding scheme design for designing a decoder that runs partly in parallel at first to follow the above mentioned line and form an appropriate code for the decoder (for example, see Non-Patent Document 2).

Non-Patent Document 2: E. Bautillon, J. Castura, and F. R. Kschischang, "Decoder-First Code Design", the 2nd Internatinal Symposium on Turbo Codes and Related Topics, pp. 459-462, 2000.

FIG. 15 is a block diagram of decoder disclosed in Non-Patent Document 2.

The decoder of FIG. 15 will be described.

Memory means 1501 holds a received value and a message $c(i)$ of [expression 2]. The decoder of FIG. 15 has a plurality of this memory means.

Address generation means 1502 generates an address to access memory means 1501, corresponding one-to-one with memory means 1501.

Variable node function means 1503 is a circuit to process [expression 1], corresponding one-to-one with memory means 1501.

Check node function means 1504 is a circuit to process [expression 2]. The number of inputs and outputs corresponds to the number of edges of a check node in Tanner graph.

Shuffle network means 1505 determines the connection between variable node function means 1503 and check node function means 1504.

In this decoder, respective variable node function means 1503 corresponds one-to-one with memory means 1501 so that they can operate in parallel without any collision between accesses to memory means 1501.

In addition, all the inputs to respective check node functions can be obtained concurrently on this occasion so that check node function means 1505 can also operate in parallel.

In this manner, a partially parallel process can be effectively provided with the decoder of FIG. 15.

However, the decoder of FIG. 15 has not had its configuration optimized, remaining to be simplified further. In optimizing the decoder, care must be taken to avoid degradation of coding performance.

Non-Patent Document 2 does not specifically mention how to give address generation means and shuffle network means.

Moreover, in the configuration of FIG. 15, a shuffle network permutates all the output from variable node function means. That can cause a schedule controlling processes to be complicated when a smaller part operates in parallel in order to meet resource on implementation.

SUMMARY OF THE INVENTION

The present invention is provided to solve the above-mentioned problems with a purpose of providing an error correcting code decoding device, a program and a method used therein, which is simpler and more flexible than conventional devices, in error correcting code decoding device, a program and a method used therein on a LDPC code.

A first decoding device to accomplish a purpose of the present invention is a decoding device based on Message-Passing decoding on a Low-Density Parity-Check Code, comprising:

a plurality of memory means for storing a received value and a message generated during the decoding;

a plurality of variable node function means in the decoding;

a plurality of check node function means in the decoding;

a plurality of address generation means for generating an address of the memory means; and a plurality of shuffle network means for determining a connection between the variable node function means and the check node function means;

wherein the address generation means generates the address on the basis of a plurality of permutations and each of the shuffle network means being connected to some of the variable node function means, the connection being determined on the basis of a plurality of permutations, a change of the permutations in the address generation means and a change of the permutations in the shuffle network means being performed in the same cycle in a decoding process.

A second decoding device to accomplish a purpose of the present invention is the first decoding device, wherein the address generation means singly generates an address for all of the memory means; and wherein the shuffle network means is singly connected to all of the variable node function means.

A third decoding device to accomplish a purpose of the present invention is the first or second decoding device, wherein the memory means stores the message with a sum thereof.

A fourth decoding device to accomplish a purpose of the present invention is the first, second or third decoding device, wherein the address generation means is provided as a counter.

A fifth decoding device to accomplish a purpose of the present invention is the first, second, third, or fourth decoding device, wherein a permutation by the shuffle network means is determined on the basis of a Galois field calculation.

A sixth decoding device to accomplish a purpose of the present invention is the first, second, third, fourth, or fifth decoding device, wherein the decoding corrects a message of an output from the check node function means by multiplying it by a coefficient less than 1 on the basis of the min-sum algorithm.

A seventh decoding device to accomplish a purpose of the present invention is the first, second, third, fourth, fifth, or sixth decoding device, wherein in the decoding, the check node function means holds the minimum value of the absolute value of an input message and an index thereof, and the second minimum value of the input message and information whether the input message is positive or negative on the basis of the min-sum algorithm.

An eighth decoding device to accomplish a purpose of the present invention is the first, second, third, fourth, fifth, sixth, or seventh decoding device, wherein decoding on a different code is dealt with by changing only the address generation means.

A ninth decoding device to accomplish a purpose of the present invention is the first, second, third, fourth, fifth, sixth, seventh, or eighth decoding device, wherein decoding on an uniform Low-Density Parity-Check Code is implemented by providing a function to always send a message that the output has a codeword bit with an extremely high probability of 0 to a set of the variable node function means corresponding to one of the address generation means and the shuffle network means.

A first program to accomplish a purpose of the present invention is a program to cause a computer to perform decoding on the basis of Message-Passing decoding on a Low-Density Parity-Check Code, wherein the program causes the computer to function as:

a plurality of variable node function means in the decoding;

a plurality of check node function means in the decoding;

address generation means for generating addresses of a plurality of memory means that store a received value and a message generated during the decoding, on the basis of a plurality permutations; and shuffle network means for determining a connection between variable node function means and check node function means on the basis of a permutation changed in the same cycle as that of the address generation means.

A second program to accomplish a purpose of the present invention is the first program, wherein the memory means stores the message with a sum thereof.

A third program to accomplish a purpose of the present invention is the first or second program, wherein the program determines a permutation in the shuffle network means on the basis of a Galois field calculation.

A fourth program to accomplish a purpose of the present invention is the first, second, or third program, wherein the decoding corrects a message of an output from the check node function means by multiplying it by a coefficient less than 1 on the basis of the min-sum algorithm.

A fifth program to accomplish a purpose of the present invention is the first, second, third, or fourth program, wherein in the decoding, the check node function means holds the minimum value of the absolute value of an input message and an index thereof, and the second minimum value of the input message and information whether the input message is positive or negative on the basis of the min-sum algorithm.

A sixth program to accomplish a purpose of the present invention is the first, second, third, fourth, or fifth program, wherein decoding on a different code is dealt with by changing only the function of the address generation means.

A seventh program to accomplish a purpose of the present invention is the first, second, third, fourth, fifth, or sixth program, wherein decoding on an uniform Low-Density Parity-Check Code is implemented by providing a function to always send a message that the output has a codeword bit with an extremely high probability of 0 to a set of the variable node function means corresponding to one of the address generation means and the shuffle network means.

A first decoding method to accomplish a purpose of the present invention is a decoding method on the basis of Message-Passing decoding on a Low-Density Parity-Check Code, comprising the steps of:

generating an address of a memory storing a received value and a message generated during the decoding on the basis of a plurality permutations;

connecting a plurality of variable node function in the decoding and a plurality of check node function in the decoding on the basis of a permutation changed in the same cycle as that of the address generation means.

A second decoding method to accomplish a purpose of the present invention is the first decoding method, wherein the memory stores a message with a sum thereof.

A third decoding method to accomplish a purpose of the present invention is the first or second decoding method, wherein a connection between a variable node function and a check node function is determined on the basis of a Galois field calculation.

A fourth decoding method to accomplish a purpose of the present invention is the first, second, or third decoding method, wherein the decoding corrects a message of an output from the check node function by multiplying it by a coefficient less than 1 on the basis of the min-sum algorithm.

A fifth decoding method to accomplish a purpose of the present invention is the first, second, third, or fourth decoding method, wherein in the decoding, the check node function holds the minimum value of the absolute value of an input message and an index thereof, and the second minimum value of the input message and information whether the input message is positive or negative on the basis of the min-sum algorithm.

A sixth decoding method to accomplish a purpose of the present invention is the first, second, third, fourth, or fifth decoding method, wherein decoding on a different code is dealt with by changing address generation in memory.

BRIEF DESCRIPTION OF THE DRAWINGS

FIG. 3 shows a construction of a parity check matrix for a LDPC code applied to the first embodiment;

FIG. 8 is a block diagram of coding equipment corresponding to the decoding device according to the present invention;

FIG. 9A is a diagram showing an exemplary parity check matrix for a LDPC code applied to the first embodiment;

FIG. 9B is a diagram showing an exemplary parity check matrix for a LDPC code applied to the first embodiment;

FIG. 9C is a diagram showing an exemplary parity check matrix for a LDPC code applied to the first embodiment;

FIG. 10A is a diagram showing an exemplary configuration of memory means in the first embodiment;

FIG. 10B is a diagram showing an exemplary configuration of memory means in the first embodiment;

DETAILED DESCRIPTION OF THE PREFERRED EMBODIMENTS

Now, embodiments of the present invention will be described in detail with reference to drawings.

Figure 1:
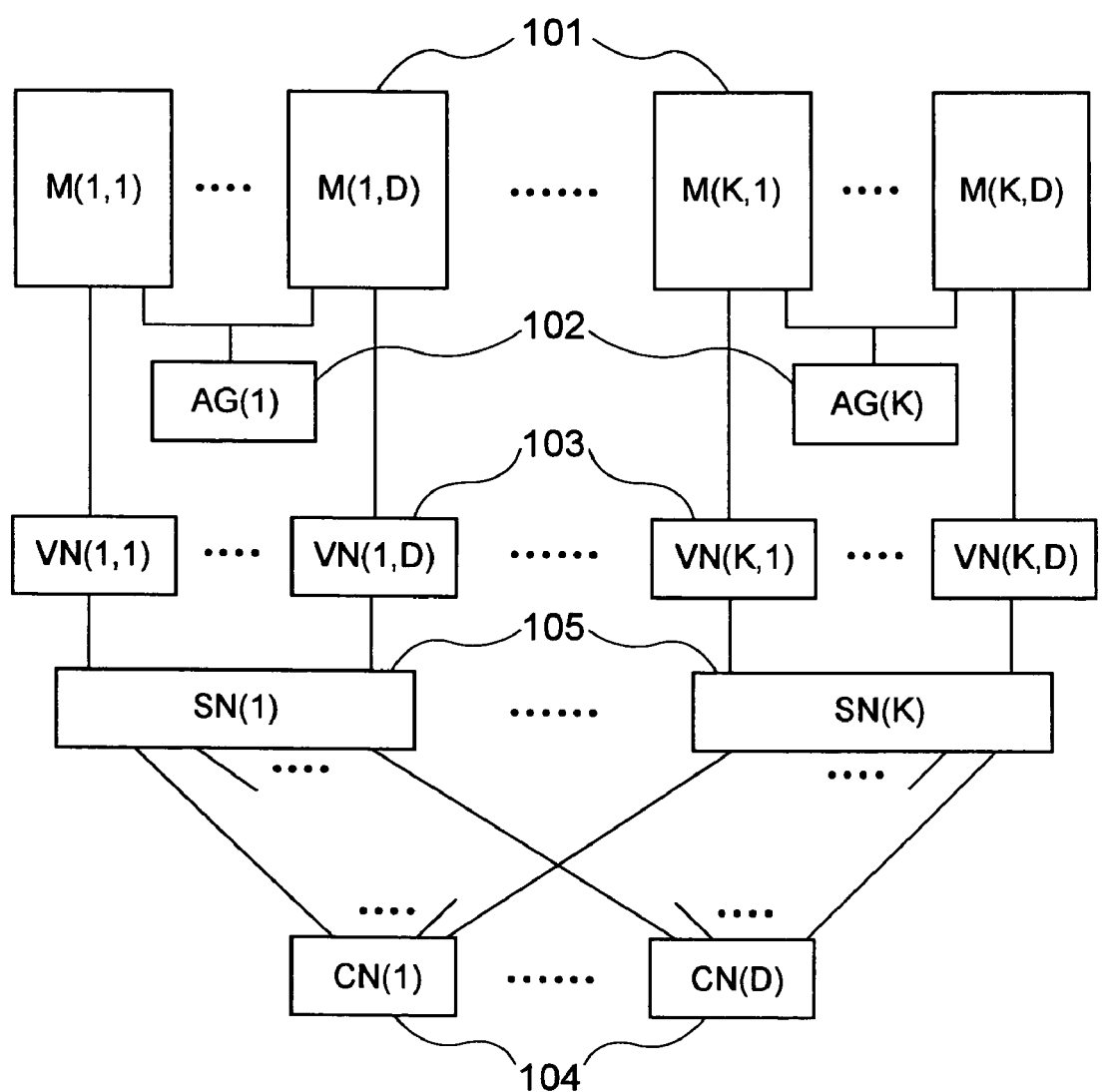
FIG. 1 is a block diagram showing a configuration of a first embodiment of the present invention.

Referring to FIG. 1, the present invention includes memory means 101 for storing a received value and a message required in MP decoding, address generation means 102 for generating an address to access to memory means 101, variable node function means 103 for processing a variable node in MP decoding, check node function means 104 for processing a check node in MP decoding, and shuffle network means 105 for connecting variable node means 103 and check node means 104.

These components will be outlined in conjunction with FIG. 1. It is assumed that K and D are integers determined by a decoder, where k is an integer from 1 to K and d is an integer from 1 to D.

Memory means 101 is a group of memory cells consisting of DK memory cells from M(1, 1) to M (K, D) corresponding to a set of codeword bits, storing a received value corresponding to a variable node and a message to be an input to the variable node. When the number of edges and a quantity of a message are large, M(k, d) may be implemented with a plurality of memory cells.

Address generation means 102 consists of K circuits from AG(1) to AG(K).

AG(k) generates an address on the basis of a plurality of permutations with the same threshold, wherein an address is generated for each of D memory cells from M(k, 1) to M(k, D). Each AG(k) cyclically uses a plurality of permutations. AG(k) may be implemented as a circuit generating an address in real time, or may be implemented by using memory (ROM).

Variable node function means 103 consists of DK circuits from VN(1, 1) to VN(K, D) for processing a variable node in MP decoding. Each VN(k, d) reads a received value and a message from memory means 102, M (k, d), and generates one output to be an input to check node function means. VN (k, d) also has a function of controlling writing into memory means, M(k, d). This function can also be provided by preparing another means.

Check node function means 104 consists of D circuits from CN(1) to CN(D) for processing a check node in MP decoding. It reads a message generated at a plurality of variable node generation means 103, and generates a message to be an input to each variable node. The generated message is stored in memory means 101.

Shuffle network means 105 consists of K circuits from SN(1) to SN(K), which connect variable node function means 103 and check node function means 104. SN(k) connects respective Input/Output interfaces in one of VN(k, 1) to VN(k, D) and CN(1) to CN(D) one-to-one. Each SN(k) is provided by using a plurality permutations over a set {1,2, . . . ,D}.

Now, an entire operation of the embodiment will be described in detail with reference to FIGS. 2, 3, 4, and 5.

Figure 2:
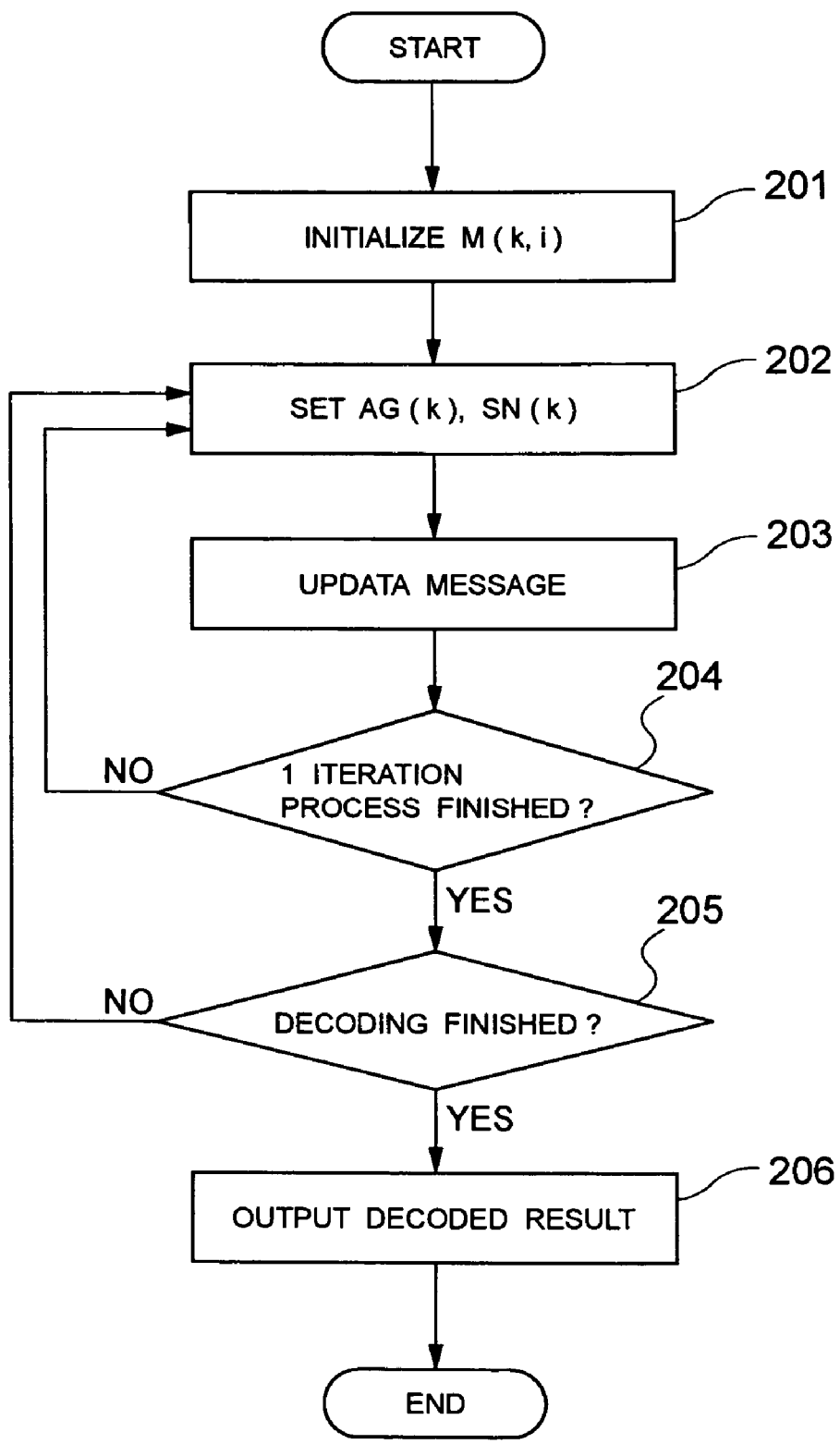
FIG. 2 is a flow chart describing operations of the first embodiment.

FIG. 2 is a flow chart outlining operations of a decoding device according to the present invention.

First, memory means 101 is initialized with a received value (step 201).

Next, address generation means 102 and shuffle network means 105 are set (step 202).

Then, a message is updated by operating memory means 101, variable node function means 103 and check node function means 104 under the control of the set address generation means 102 and shuffle network means 104 (step 203).

Determination is made whether 1 iteration process is finished or not in MP decoding (step 204 in FIG. 2).

If not finished, the operation returns to step 202, where a message is updated for the next setting of address generation means 102 and shuffle network means 105.

If 1 iteration process is finished in step 204, determination is made whether to finish the decoding or not (step 205 in FIG. 2). The determination on whether to finish the decoding or not is performed by determining whether a hard determination result satisfies every check of a parity check matrix or not. The hard determination result may be stored in a memory means 101 or may be stored in further prepared memory means.

If it is determined to finish in step 205, decoded result is output and the decoding finishes (step 206 in FIG. 2). If it is not determined to finish, the operation returns to step 202, where the decoding continues keeping the setting of address generation means 102 and shuffle network means 105 as it was when the 1 iteration began.

Figure 4:
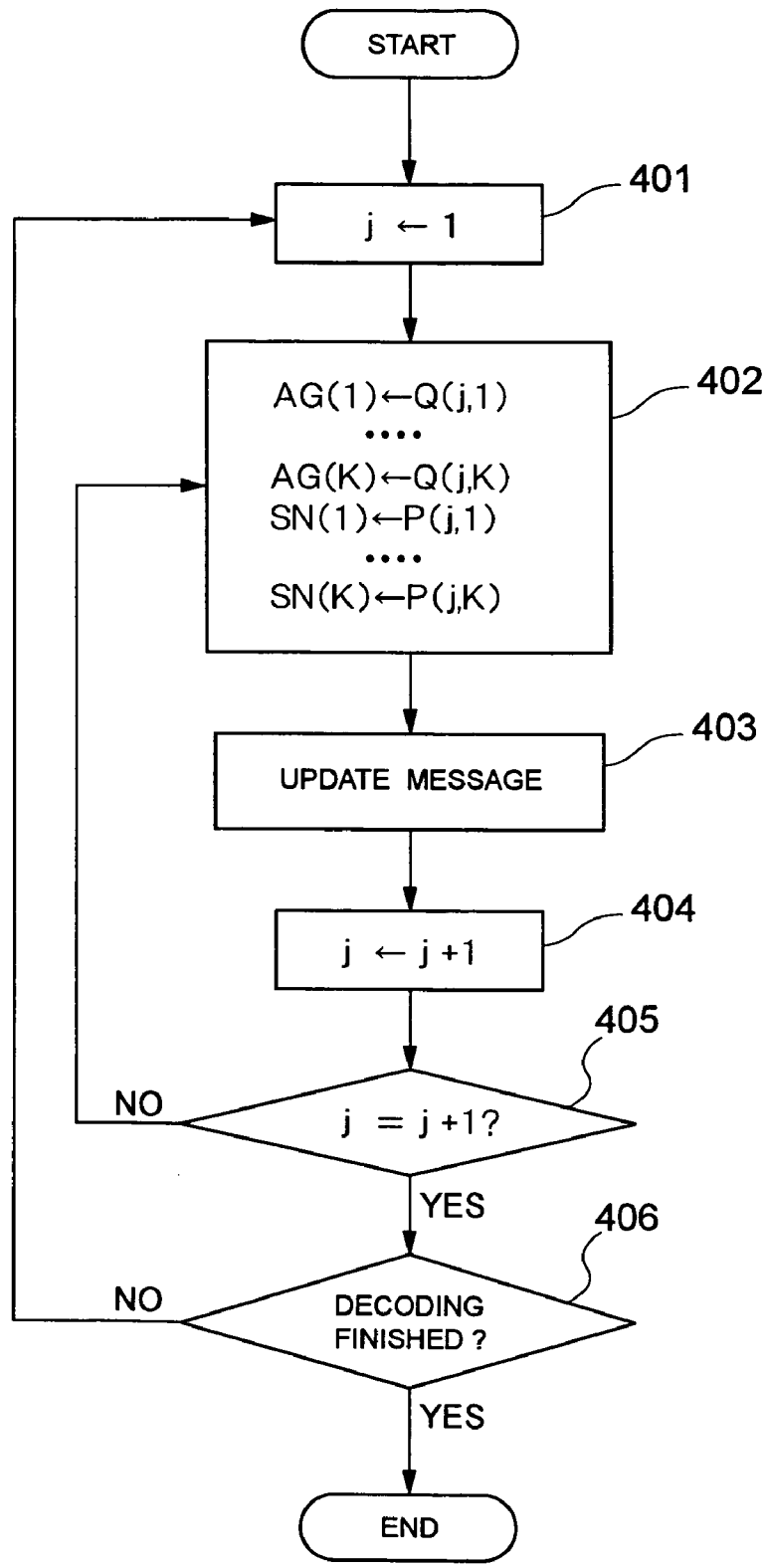
FIG. 4 is a flow chart describing operations of the fist embodiment for the parity check matrix in FIG. 3.

FIGS. 3 and 4 detail a flow of processes of steps 202 to 205.

FIG. 3 shows a construction of a parity check matrix for a LDPC code applied to the decoder of the present invention.

Parity check matrix 301 shows a construction of a parity check code where a permutation matrix R(j, k) is arranged in J×K. A structural formula 302 of block R(j, k) of a parity check matrix shows that R(j, k) is further expressed by a Kronecker product of two permutation matrices Q(j, k) and P(j, k). R (j, k) is a matrix defined by being replaced with P (j, k) when an element of Q (j, k) is 1, and replaced with 0 matrices in the same size as that of P (j, k) when an element of Q (j, k) is 0.

D of FIG. 1 corresponds to the size of P(j, k). When Q (j, k) has size E, R(j, k) would be a permutation matrix in the size of DE.

FIG. 4 is a flow chart detailing a flow of processes of steps 202 to 205, especially that of step 202, when the number K of address generation means 102 and shuffle network means 105 is the same as the number of column blocks in check matrix in FIG. 3 for the parity check matrix of FIG. 3.

First, an index j of row block of a parity check matrix is set to initial value (j=1) (step 401).

Next, address generation means 102 of AG (1) to AG (K) is set to Q (j, 1) to Q (j, K), and shuffle network means 105 of SN (1) to SN (K) is set to P(j, 1) to P (j, K) (step 402).

Message updating of step 403 will be detailed later.

Next, when j is incremented by 1 and j=J+1 is obtained, it is determined that 1 iteration process is finished (steps 404, 405).

When 1 iteration process is not finished, the operation returns to step 402. If not, determination is made whether to finish or not as in step 205 (step 406).

If it is not determined to finish, the operation returns to step 401, where a new iteration process begins.

Figure 5:
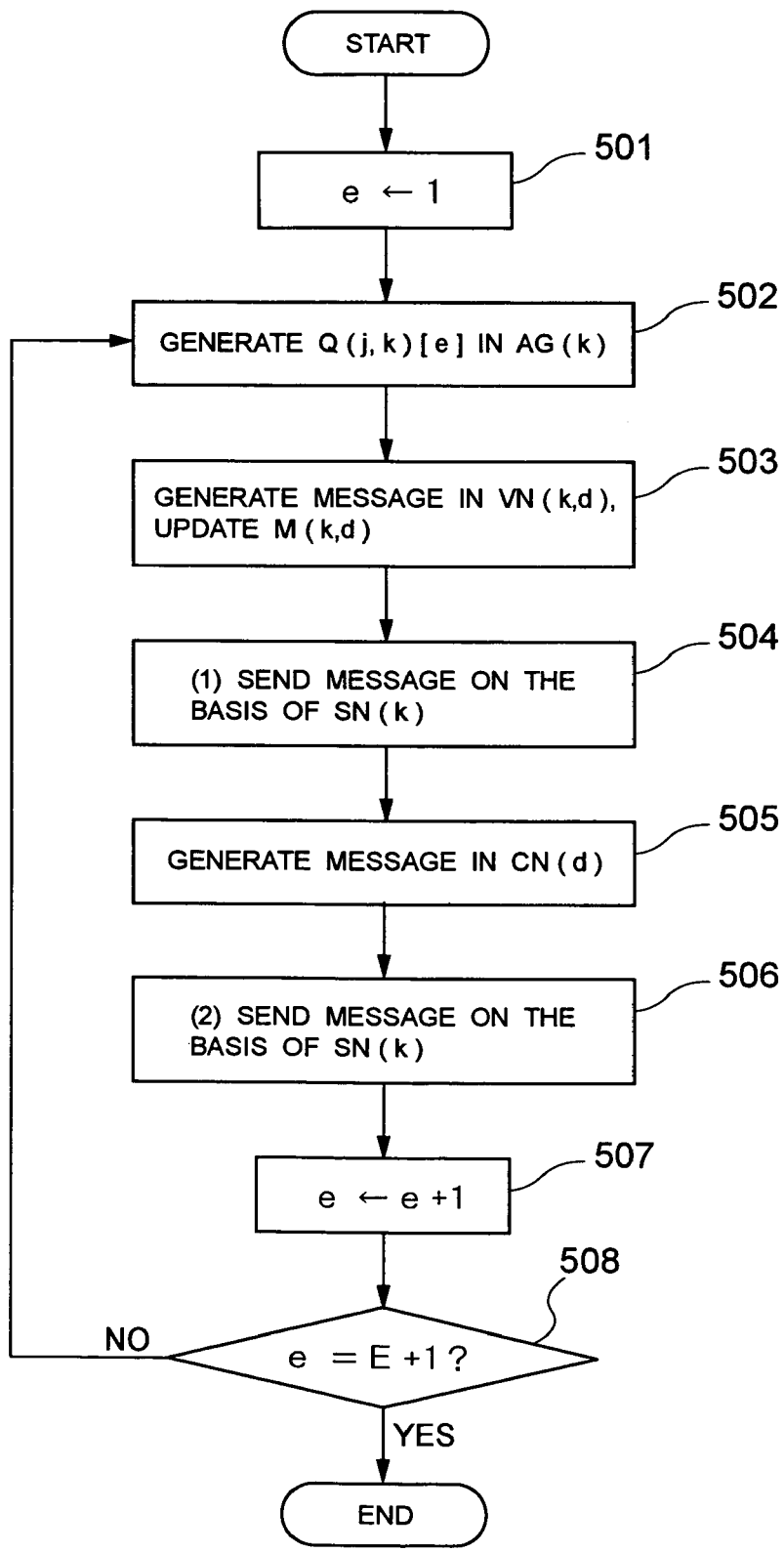
FIG. 5 is a flow chart describing operations of the first embodiment for the parity check matrix in FIG. 3.

FIG. 5 is a chart describing message updating in step 403 of FIG. 4. It is assumed that k takes every integer from 1 to K, and d takes every integer from 1 to D hereinafter.

It is assumed that permutation matrix Q(j, k) has size E and Q(j, k)[e] represents the location of e'th row in Q(j,k), which is filled with 1. First, index e of a row in Q(j, k) is initialized (e=1)(step 501).

Next, address generation means 102, AG(k) generates Q(j, k)[e] (step 502).

Then, variable node function means 103, VN (k, d) reads a received value of an address determined on the basis of Q(j, k) [e] and a message from memory means M(k, d) and generates a message to check node function means 105. It also updates the contents of an address specified at the previous step in M(k, d) by using a message generated at check node function means at the previous step (step 503).

Messages generated from VN (k, 1) to VN (k, D) are sent to check node function means 105 via shuffle network means SN(k) (step 504).

SN(k) connects variable node function means and check node function means in the order determined by permutation matrix P(j, k).

Check node function means generates a message (step 505). Here, CN(d) generates a message for each edge.

A message generated by CN(d) is returned to variable node function means on the basis of SN(k) (step 506).

When "e" is incremented by 1 and e=E+1 is obtained, it is determined that a process, in which AG(k) is based on Q(j, k) and SN(k) is based on P(j, k), is finished (steps 507, 508).

If it is determined otherwise, the operation returns to step 502, where the process continues. Processes of steps 501 to 507 can be pipelined.

Now, the second embodiment of the present invention will be detailed with reference to drawings.

One of the most outstanding features of the present invention is that shuffle network means 105 consists of a plurality of local shuffle networks from SN(1) to SN(K).

Address generation means 102 also generates an address to memory means in the same unit as shuffle network means 105 does. Therefore, any parallel degree can be provided on the basis of the unit configured like this. In other words, the parallel degree and the device complexity can be adjusted by appropriately setting the size of K in FIG. 1 irrespective of the number of column blocks in a parity check matrix in FIG. 3.

Figure 6:
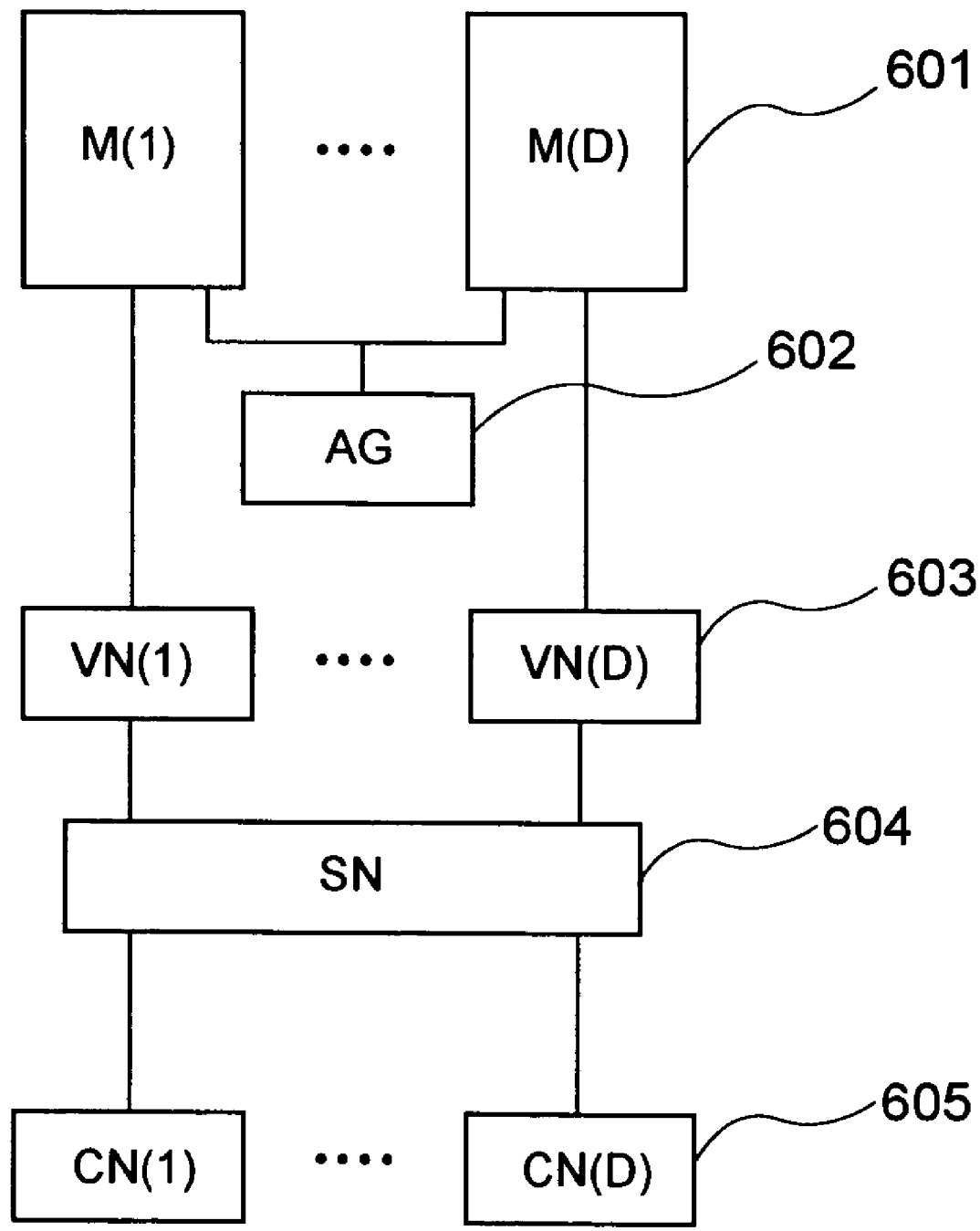
FIG. 6 is a block diagram showing a configuration of a second embodiment of the present invention.

The second embodiment according to the present invention is described particularly in the case of K=1 in FIG. 1. Referring to FIG. 6, the embodiment consists of memory means 601 (M(1), ..., M(D)) address generation means 602 (AG), variable node function means 603 (VN(1), ..., VN(D)), shuffle network means 604 (SN), and check node function means 605 (CN(1), ..., CN(d)). Address generation means 602 needs to be shared in a single circuit, enabling more number of address patterns to be generated than address generation means 102 of FIG. 1 does. Shuffle network means 604 also needs to consist of a single circuit, enabling more number of permutations to be represented than check node function means 104 of FIG. 1 does. Check node function means 605 may have simpler configuration because the number of inputs at the same time is smaller than that of shuffle network means 105 in FIG. 1.

Figure 7:
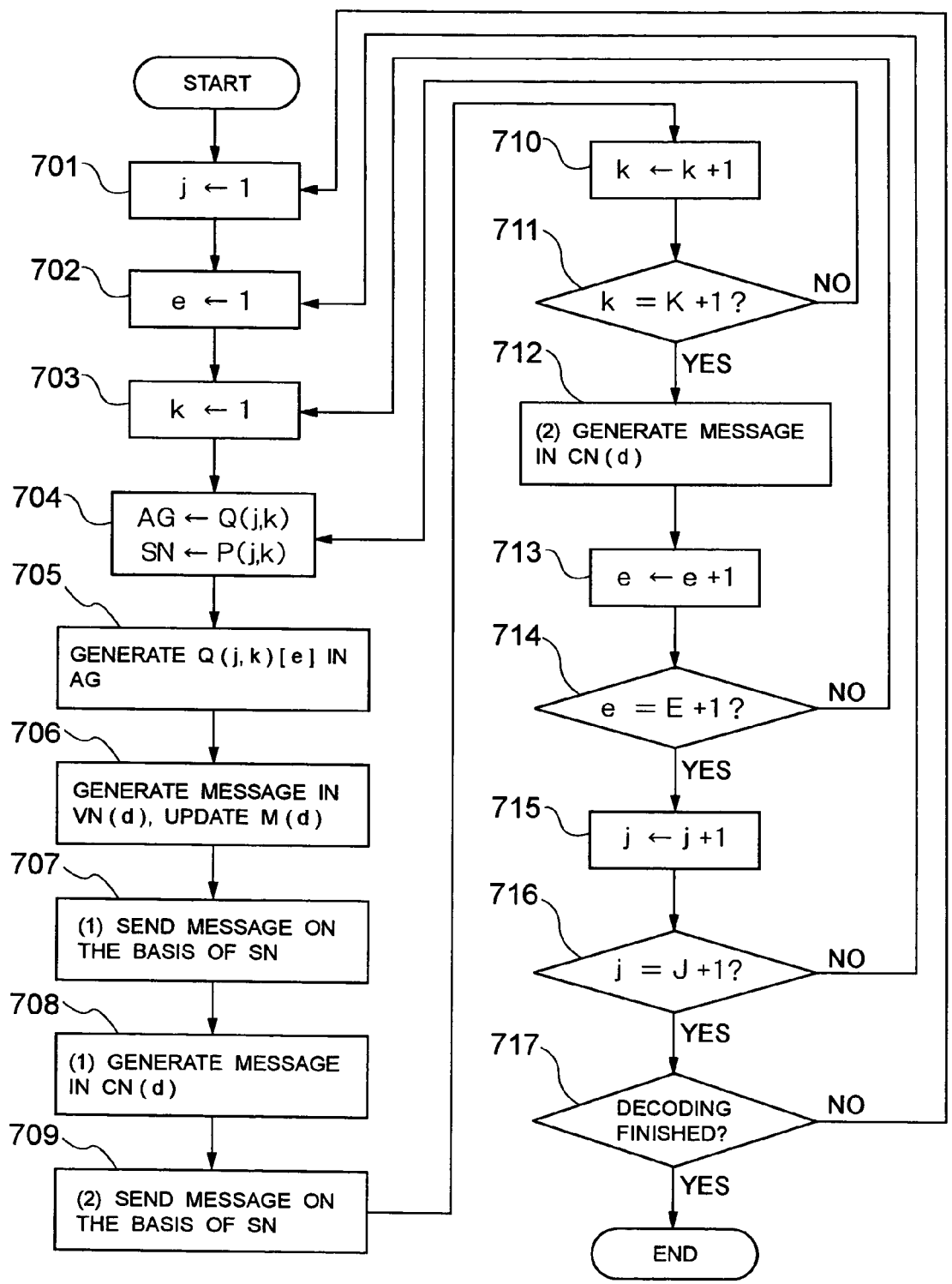
FIG. 7 is a flow chart describing operations of the second embodiment.

FIG. 7 is a detailed flow chart of processes when the decoder of FIG. 6 is applied to a LDPC code with a parity check matrix of FIG. 3 (in comparison with FIGS. 5 and 6). In FIG. 7, j denotes a row-wise index of blocks in the parity check matrix of FIG. 3 and k denotes a column-wise index of blocks.

"e" represents an index of a row of Q(j, k) of FIG. 3 (size E). First, j is initialized (j=1) (step 701). Then, e is initialized (e=1) (step 702).

Next, k is initialized (k=1) (step 703). Address generation means 602, AG and shuffle network means 604, SN are set to Q(j, k) and P(j, k), respectively, on the basis of set j and k(step 704).

Next, address Q(j, k)[e] of M(1), ..., M(D) is generated in AG (step 705).

A message is generated on the basis of information read in VN (d) of variable node function means 603 and at the same time, the contents of M(d) is updated by using a message previously generated in check node function means 605 (step 706).

A message generated at step 706 is sent to check node function means 605 via SN (step 707).

A message is updated in CN(d) of check node function means 605 (step 708). Unlike in the step 505 of FIG. 5, CN(d) does not have all the inputs. Thus, message generation is performed halfway at each step. Then, a message having generated this time from the messages previously generated in CN (d) is sent through SN to variable node function means (step 709). This will be a message for updating M(d) at step 706.

A column-wise index is updated and determination is made whether column-wise processes are finished or not (steps 710, 711).

If the processes are finished, a message is generated in CN(d) (step 712).

An index of Q(j, k) is updated and determination is made whether to update a message or not for the column next to Q(j, k) (steps 713, 714).

Steps 715, 716, and 717 in FIG. 7 are the same as steps 404, 405, and 406 in FIG. 4.

EXAMPLES

Now, operation of the embodiment will be described by using specific examples.

A coding method will be described before describing a decoding method. In decoder 801, redundant P's are added to information U so that a parity check matrix is multiplied by the P's to obtain 0 as shown in FIG. 8.

A matrix used here is not an exact H that is used in a decoder. Matrix H' can be used, in which columns are permutated for easier coding.

In this case, codes are transmitted via interleave 802 so that the codes are in the order in the decoder.

FIGS. 9A to 9C show specific examples of a parity check matrix of FIG. 3. FIGS. 9A to 9C show examples where J=2, K=3, and parity check matrix component 901 is Q(j, k) (size E=2).

In parity check matrix componet 901, Q(2,1) corresponds to the lower left submatrix of 2×2 and Q(1,3) corresponds to the upper right submatrix of 2×2, for example. This is the same for parity check matrix component 902, P(j, k) (size D=3). Parity check matrix 903 is a parity check matrix whose submatrix is a permutation represented by a Kronecker product of Q(j, k) of parity check matrix component 901 and P(j, k) of parity check matrix componet 902.

Now, an example of the decoder shown in FIG. 1 will be described on the basis of a parity check matrix in FIGS. 9A to 9C.

FIG. 10A shows an exemplary configuration of memory means 101, indicating which number of data of codeword bit is held in each entry of M (k, d). For example, M(1,1) indicates data corresponding to the first and the fourth codeword bit is held, while M(2,1) indicates data corresponding to the seventh and the tenth codeword bit is held. Usually, M(k, d) holds data corresponding to E codeword bits at intervals of D. FIG. 10B shows a structure of an entry of M (k, d).

Referring to the graphs of a parity check matrix of FIGS. 9A to 9C, the number of edges of variable node is two. The graph consists of two messages, c(1) and c(2), and a received value.

Flows of the processes of FIGS. 5 and 6 will be described in conjunction with the parity check matrix of FIGS. 9A to 9C.

First, j=1 is set at step 401, and AG(1), AG(2), AG(3), SN(1), SN(2), SN(3) are set on the basis of Q(1,1), Q(1,2), Q(1,3), P(1,1), P(1,2), P(1,3), respectively.

Next, e=1 is set at step 501, and each of AG(1), AG(2), and AG(3) generates an address.

Q(j, k) of parity check matrix component 901 in FIG. 9 consists of two types of permutations, and generates an address such as expression [expression 4] for (j, k)=(1, 1), (1, 3), (2, 2).

$$Q(j, k)[1]=1, Q(j, k)[2]=2 \qquad \text{[expression 4]}$$

It also generates an address such as expression [expression 5] for (j, k)=(1, 2), (2, 1), (2,3).

$$Q(j, k)[1]=2, Q(j, k)[2]=1 \qquad \text{[expression 5]}$$

Thus, addresses generated in AG(1), AG(2), AG(3) when j=1, e=1 are found to be 1, 2, 1 from [expression 4] and [expression 5], respectively. An index of codeword bits for the addresses is 1,2,3,10,11,12,13,14,15 in order from FIG. 10. It should be noted that this index corresponds to the column numbers of the first three rows each of whose element is 1 in parity check matrix 903 in FIG. 9C, as a matter of course.

Figure 11:
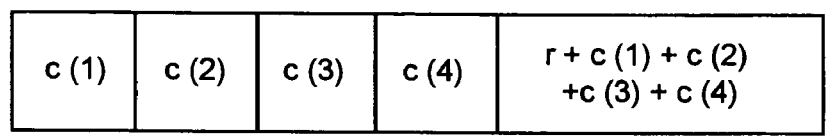
FIG. 11 is a diagram showing an exemplary configuration of memory means in the first embodiment.

It is assumed that a message of FIG. 11 corresponding to the m'th codeword bit and a received value are represented as c(m,1), c(m,2), r(m). The messages v(k, d) generated on the basis of [expression 1] in VN(k, d) are as follows:

VN(1,1): v(1, 1)←r(1)+c(1,2)

VN(1,2): v(1, 2)←r(2)+c(2,2)

VN(1,3): v(1, 3)←r(3)+c(3,2)

VN(2,1): v(2, 1)←r(10)+c(10,2)

VN(2,2): v(2, 2)←r(11)+c(11,2)

VN(2,3): v(2, 3)←r(12)+c(12,2)

VN(3,1): v(3, 1)←r(13)+c(13,2)

VN(3,2): v(3, 2)←r(14)+c(14,2)

VN(3,3): v(3, 3)←r(15)+c(15,2)   [expression 6]

Shuffle network means SN(1), SN(2), SN(3) are based on permutation matrix, P(1,1), P(1,2), P(1,3) of parity chech matrix component 902 in FIG. 9B. Thus, inputs into check node function means CN(1), CN(2), and CN(3) are as follows:

CN(1): v(1,3), v(2,1), v(3,2)

CN(2): v(1,2), v(2,2), v(3,3)

CN(3): v(1,1), v(2,3), v(3,1)

CN(1), CN(2), and CN(3) generate messages on the basis of [expression 2].

From[expression 6], messages generated here are as follows:

CN(1): c(3,1), c(10,1), c(14,1)

CN(2): c(2,1), c(11,1), c(15,1)

CN(3): c(1,1), c(12,1), c(13,1)   [expression 7]

The messages generated are sent via SN(1), SN(2), and SN(3) to update M(k, d).

In the next step of j=1, e=2, following a branch of step 508, AG(k) and SN(k) process a message for a codeword bit whose address in M(k, d) corresponds to Q(j, k)[2] without any change. [expression 6] and [expression 7] are as follows:

VN(1,1): v(1, 1)←r(1)+c(4,2)

VN(1,2): v(1, 2)←r(2)+c(5,2)

VN(1,3): v(1, 3)←r(3)+c(6,2)

VN(2,1): v(2, 1)←r(10)+c(7,2)

VN(2,2): v(2, 2)←r(11)+c(8,2)

VN(2,3): v(2, 3)←r(12)+c(9,2)

VN(3,1): v(3, 1)←r(13)+c(16,2)

VN(3,2): v(3, 2)←r(14)+c(17,2)

VN(3,3): v(3, 3)←r(15)+c(18,2)

CN(1): c(6,1), c(7,1), c(17,1)

CN(2): c(5,1), c(8,1), c(18,1)

CN(3): c(4,1), c(9,1), c(16,1)

In the next step of j=2, e=1, the operation returns from a branch of step 405 to step 402, where AG(1), AG(2), AG(3), SN(1), SN(2), SN(3) are set to Q(2,1), Q(2,2), Q(2,3), P(2,1), P(2,2), P(2,3), respectively. [expression 6] and [expression 7] are as follows:

VN(1,1): v(1, 1)←r(4)+c(4,1)

VN(1,2): v(1, 2)←r(5)+c(5,1)

VN(1,3): v(1, 3)←r(6)+c(6,1)

VN(2,1): v(2, 1)←r(7)+c(7,1)

VN(2,2): v(2, 2)←r(8)+c(8,1)

VN(2,3): v(2, 3)←r(9)+c(9,1)

VN(3,1): v(3, 1)←r(16)+c(16,1)

VN(3,2): v(3, 2)←r(17)+c(17,1)

VN(3,3): v(3, 3)←r(18)+c(18,1)

CN(1): c(6,2), c(8,2), c(16,2)

CN(2): c(4,2), c(9,2), c(18,2)

CN(3): c(5,2), c(7,2), c(17,2)

j=2, e=2 are processed in the same manner and the 1 iteration process finishes.

Variations on components shown in FIG. 1 will be described below. When a variable node has a high order, r and the sum of messages may be held in place of r in each entry of memory means as shown in FIG. 11. In FIG. 11, [expression 1] is processed by a single subtraction. That can reduce computational complexity for a high order of variable node.

For address generation means 102, device complexity can be reduced by generating an address by a simple circuit. The simplest permutation is a cyclic permutation, which can be provided by cyclically using a counter. A different permutation can be represented by changing the initial value of the counter. Decoding is available for a code with a different code length by changing a cycle of the counter.

When address generation means is made up by cyclic permutations, coding performance can be improved by shuffle network means 105 to use more complex permutations than it. As a method that is easy to be implemented as a circuit, there is a method using multiply and divide of Galois field and exponent/logarithm calculation.

Check node function means 105 is relatively easy to be implemented when it uses the min-sum algorithm as MP decoding. In this case, decoding performance is lower than that of sum-product algorithm, whose decoding performance is the best. In order to deal with this problem, such a feature can be improved by multiplying a message generated at a check node by a positive number less than 1.

Figure 12:
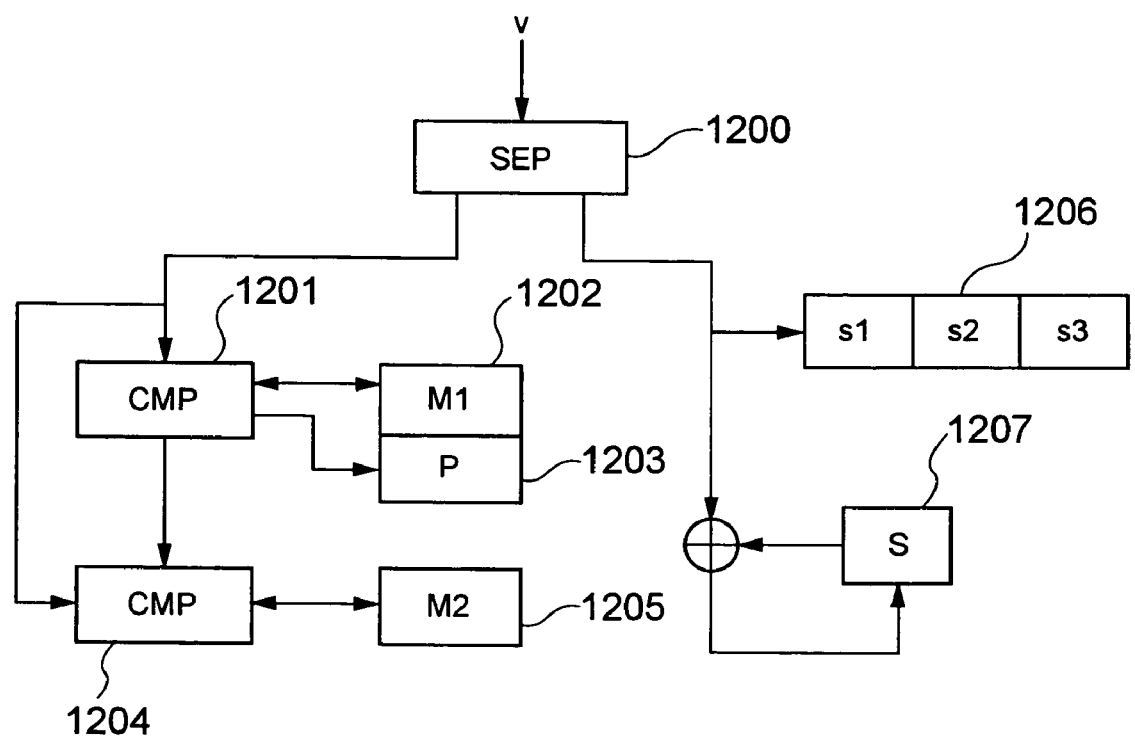
FIG. 12 is a diagram showing an exemplary configuration of check node function means in the second embodiment.

In the second embodiment of FIG. 6, check node function means 605 obtains one input at each step. When the min-sum algorithm of [expression 2] is used, check node function means can be easily implemented as shown in FIG. 12. A message from variable node function means is divided into an absolute value part and a positive/negative sign part in dividing means 1200. An absolute value part obtains the minimum two values by using comparator 1201 and 1204. Register 1202 holds the minimum absolute value and register 1205 holds the second minimum absolute value. Register 1203 holds an index, which is the minimum absolute value. A positive/negative sign part is held in register 1206 and overall exclusive OR is also held in register 1207. With such rich information, an output of [expression 2] can be easily generated for each edge.

The embodiment has been described for a regular LDPC code, in which the numbers of 1 in a row and a column are regular as in the parity check matrix of FIG. 3. The present invention can also be applied to an irregular LDPC code. An irregular LDPC code can be made up by replacing some blocks with a zero matrix in (P (j, k)), (Q (j, k)) in FIG. 4.

In this case, the decoder shown in FIGS. 1 and 6 can be applied. The decoder of FIG. 1 can be dealt with by always setting the part where a zero matrix falls as having high probability of zero. In a decoder in FIG. 6, the part where a zero matrix falls can be merely skipped.

Figures 13, 14A, 14B:
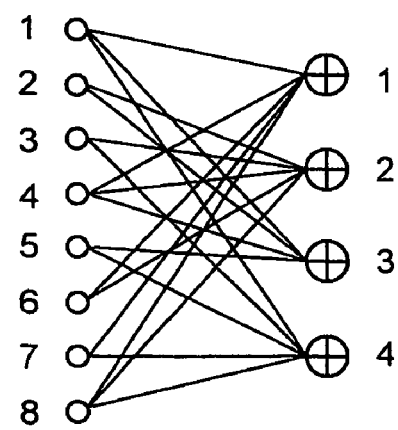
FIG. 13 is a diagram showing an exemplary parity check matrix for an irregular LDPC code, to which the present invention is applied.
FIG. 14A is a diagram showing an example of a parity check matrix H for an LDPC code.
FIG. 14B is a diagram showing an example of a Tanner graph G for an LDPC code.
Figure 15:
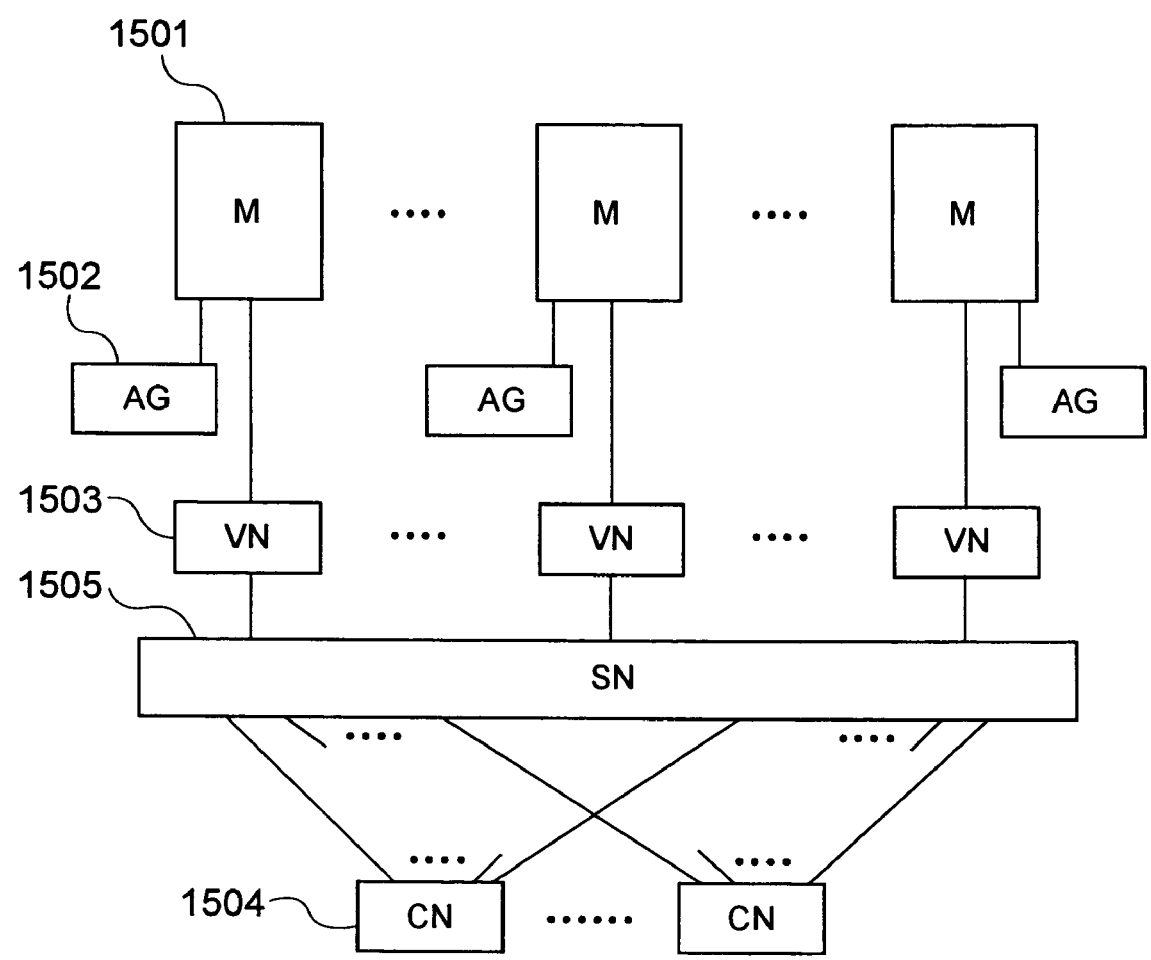
FIG. 15 is a diagram showing a conventional decoding device.

FIG. 13 is an example of an irregular parity check matrix that provides a well coding feature, in which some of the permutation matrices of matrices in FIG. 4, where J=5, K=10, are replaced with zero matrices (P is a permutation matrix, and 0 is a zero matrix). The present invention operates as a decoder for a code having parity check matrices, an arrangement of such permutation matrices. Therefore, the present invention can easily give an optimal construction of an irregular parity check matrix under the condition of given J and K.

All or some of address generation means 102, variable node function means 103, check node function means 104, and shuffle network means 105 in the above mentioned first and second embodiments may be replaced with a CPU or a MPU operated with a program.

The first advantage of the present invention is that the invention can reduce the scale of a device without lowering coding performance by providing address generation means 102 and shuffle network means 105 as a plurality of permutations and associating address generation means with a plurality of memory means.

The present invention can maintain coding performance because the present invention changes permutations in address generation means 102 and shuffle network means 105 in the same cycle so that it can deal with decoding on a LDPC code with a parity check matrix shown in FIG. 3, which forms a high performance code.

The second advantage of the present invention is that the invention can provide a flexible configuration of a device, in which a tradeoff between the parallel degree and the size of a device can be adjusted. This is because each shuffle network of shuffle network means 105 is locally connected with some of variable node function means 103 so that a circuit performance can be easily scheduled even if the device is implemented in doubled scale with any parallel degree.

What is claimed is:

1. An error correcting code decoding device based on Message-Passing decoding on a Low-Density Parity-Check Code, whose parity-checkmatrix consists of sub-matrices of a Kronecker product of two permutation matrices, comprising:
   a plurality of memory means for storing a received value and a message generated during said decoding;
   a plurality of variable node function means which perform variable node processing in said decoding;
   a plurality of check node function means which perform check node processing in said decoding;
   a plurality of address generation means for generating an address of said memory means on the basis of the first permutation matrix of said sub-matrix of a Kronecker product; and
   a plurality of shuffle network means for determining a connection between said variable node function means on the basis of the second permutation matrix in said sub-matrix of a Kronecker product;
   wherein said check node functions(s) means perform(s) check node processing sequentially on a unit of said second permutation matrix,
   and said variable node functions generate messages in accordance with said current check node processing.

2. The error correcting code decoding device according to claim 1, wherein said address generation means singly generate an address for all of said memory means; and
   wherein said shuffle network means are singly connected to all of said variable node function means.

3. The error correcting code decoding device according to claim 1, wherein said memory means store said message with a sum thereof.

4. The error correcting code decoding device according to claim 1, wherein said address generation means are provided as a counter.

5. The error correcting code decoding device according to claim 1, wherein a second permutation by said shuffle network means is determined on a basis of a Galois field calculation.

6. The error correcting code decoding device according to claim 1, wherein said decoding corrects a message of an output from said check node function means by multiplying the output by a coefficient less than 1 on a basis of a min-sum algorithm.

7. The error correcting code decoding device according to claim 1, wherein in said decoding, said check node function means hold a first minimum value of an absolute value of an input message and an index thereof, and a second minimum value of the input message and information regarding whether the input message is positive or negative on a basis of a min-sum algorithm.

8. The error correcting code decoding device according to claim 1, wherein decoding on a different code is dealt with by changing only said address generation means.

9. The error correcting code decoding device according to claim 1, wherein decoding on a uniform Low-Density Parity-Check Code is implemented by providing a function to always send a message that an output has a codeword bit with an extremely high probability of 0 to a set of said variable node function means corresponding to one of said address generation means and said shuffle network means.

10. An error correcting code decoding method on a basis of Message-Passing decoding on a Low-Density Parity-Check Code, whose parity-checkmatrix consists of sub-matrices of a Kronecker product of a first permutation matrix and a second permutation matrix, the method comprising
  generating an address of a memory storing a received value and a message generated during said decoding on a basis of the first permutation matrix of said sub-matrix of a Kronecker product; and
  connecting a plurality of variable node functions in said decoding and a plurality of check node functions in said decoding on a basis of the second permutation matrix of said sub-matrix of a Kronecker product, which is a permutation changed in a same cycle as that of an address generation means; and
  outputting a decoded error correcting code.

11. The error correcting code decoding method according to claim 10, wherein said memory stores said message with a sum thereof.

12. The error correcting code decoding method according to claim 10, wherein a connection between a variable node function and a check node function is determined on a basis of a Galois field calculation.

13. The error correcting code decoding method according to claim 10, wherein said decoding corrects a message of an output from said check node functions by multiplying the output by a coefficient less than 1 on a basis of a min-sum algorithm.

14. The error correcting code decoding method according to claim 10, wherein in said decoding, said check node functions hold a first minimum value of an absolute value of an input message and an index thereof, and a second minimum value of the input message and information regarding whether the input message is positive or negative on a basis of a min-sum algorithm.

15. The error correcting code decoding method according to claim 10, wherein decoding on a different code is dealt with by changing address generation in memory.

* * * * *